United States Patent
Liaw

(10) Patent No.: US 9,196,732 B2
(45) Date of Patent: Nov. 24, 2015

(54) FIN FIELD EFFECT TRANSISTOR HAVING TAPERED SIDEWALLS, AND METHOD OF FORMING THE SAME

(71) Applicant: TAIWAN SEMICONDUCTOR MANUFACTURING COMPANY, LTD., Hsinchu (TW)

(72) Inventor: Jhon Jhy Liaw, Zhudong Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/102,644

(22) Filed: Dec. 11, 2013

(65) Prior Publication Data

US 2014/0097506 A1    Apr. 10, 2014

Related U.S. Application Data

(63) Continuation of application No. 13/476,252, filed on May 21, 2012, now Pat. No. 8,629,512.

(60) Provisional application No. 61/616,965, filed on Mar. 28, 2012.

(51) Int. Cl.

| H01L 21/02 | (2006.01) |
|---|---|
| H01L 29/78 | (2006.01) |
| H01L 29/66 | (2006.01) |

(52) U.S. Cl.
CPC ...... *H01L 29/7853* (2013.01); *H01L 29/66795* (2013.01)

(58) Field of Classification Search
USPC .................. 257/401, 288, 368, 374, E29.264, 257/E29.137, E21.014
See application file for complete search history.

(56) References Cited

U.S. PATENT DOCUMENTS

| 7,355,233 B2 | 4/2008 | Liaw |
|---|---|---|
| 8,084,845 B2 | 12/2011 | Torek et al. |

(Continued)

FOREIGN PATENT DOCUMENTS

| JP | 2008-300384 | 12/2008 |
|---|---|---|
| KR | 20050017584 | 2/2005 |
| KR | 10-2006-0046490 | 5/2006 |

OTHER PUBLICATIONS

Notice of Allowance dated Feb. 6, 2014 and English Translation from corresponding application No. KR 10-2012-0091127.

(Continued)

*Primary Examiner* — Bilkis Jahan
(74) *Attorney, Agent, or Firm* — Hauptman Ham, LLP

(57) ABSTRACT

The description relates to a fin field effect transistor (FinFET). An exemplary structure for a FinFET includes a fin having a first height above a first surface of a substrate, where a portion of the fin has first tapered sidewalls, and the fin has a top surface. The FinFET further includes an insulation region over a portion of the first surface of the substrate, where a top of the insulation region defines a second surface. The FinFET further includes a gate dielectric over the first tapered sidewalls and the top surface. The FinFET further includes a conductive gate strip over the gate dielectric, where the conductive gate strip has second tapered sidewalls along a longitudinal direction perpendicular to the first height, and a first width between the second tapered sidewalls in the longitudinal direction is greater at a location nearest to the substrate than a second width at a location farthest from the substrate.

20 Claims, 11 Drawing Sheets

(56) References Cited

U.S. PATENT DOCUMENTS

| | | |
|---|---|---|
| 8,174,073 B2 * | 5/2012 | Lee et al. .................... 257/347 |
| 8,222,114 B2 | 7/2012 | Chiu et al. |
| 8,394,690 B2 | 3/2013 | Ikeda et al. |
| 8,629,512 B2 * | 1/2014 | Liaw ............................ 257/401 |
| 2004/0262699 A1 | 12/2004 | Rios et al. |
| 2005/0218438 A1 * | 10/2005 | Lindert et al. ............... 257/296 |
| 2005/0282342 A1 | 12/2005 | Adan |
| 2007/0187682 A1 * | 8/2007 | Takeuchi et al. ............... 257/64 |
| 2008/0277745 A1 * | 11/2008 | Hsu et al. .................... 257/412 |
| 2008/0296667 A1 | 12/2008 | Mikasa |
| 2008/0296702 A1 | 12/2008 | Lee et al. |
| 2010/0187575 A1 | 7/2010 | Baumgartner et al. |

OTHER PUBLICATIONS

Office Action dated Aug. 21, 2013 from corresponding application No. KR 10-2012-0091127.

Office Action dated Nov. 26, 2014 from corresponding No. TW 101146344.

* cited by examiner

FIN FIELD EFFECT TRANSISTOR HAVING TAPERED SIDEWALLS, AND METHOD OF FORMING THE SAME

CROSS-REFERENCE TO RELATED APPLICATIONS

The present application is a continuation of U.S. application Ser. No. 13/476,252, filed May 21, 2013, which claims the priority of U.S. Provisional Application No. 61/616,965, filed Mar. 28, 2012, both of which are incorporated herein by reference in their entireties.

FIELD OF THE INVENTION

The disclosure relates to a fin field effect transistor, and a method of forming the same.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in recessed source/drain (S/D) portions of the FinFET utilizing selectively grown silicon germanium may be used to enhance carrier mobility.

However, there are challenges to implement such features and processes in complementary metal-oxide-semiconductor (CMOS) fabrication. As the spacing between vertical fins decreases, these problems are exacerbated. For example, the FinFET is not fully depleted if gate electrode does not fully wrap the channel of the FinFET, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
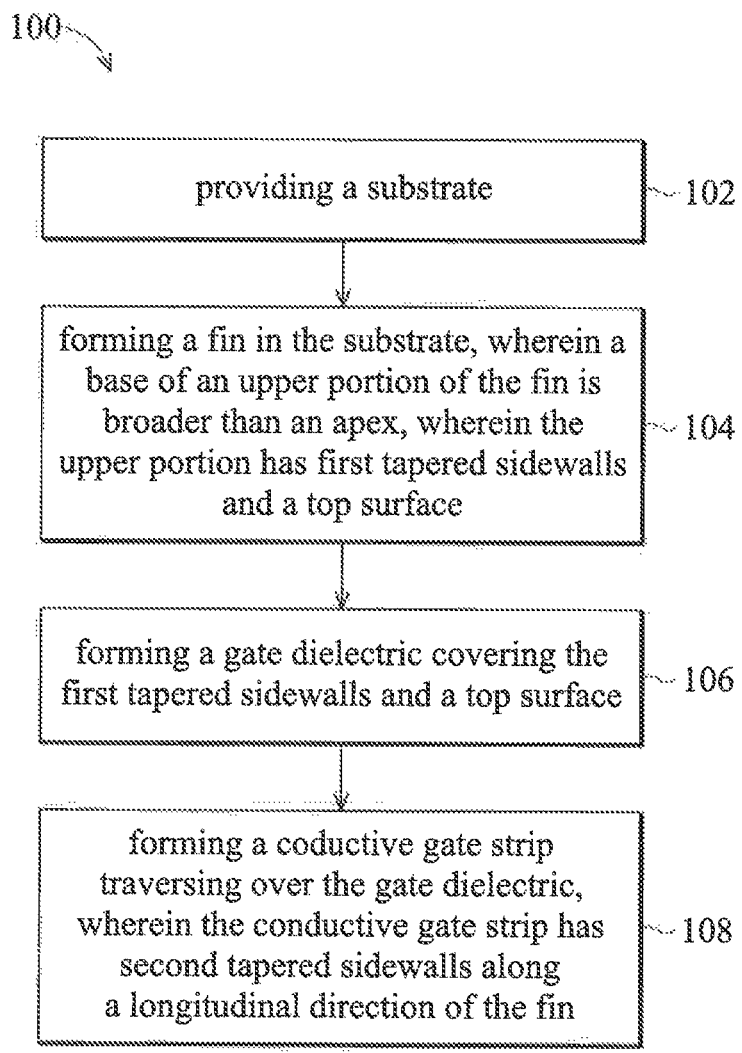
FIG. 1 is a flowchart illustrating a method of fabricating a gate stack of a Fin Field Effect Transistor (FinFET) according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a gate stack of a fin field effect transistor (FinFET) according to various aspects of the present disclosure. The method 100 begins with step 102 in which a substrate is provided. The method 100 continues with step 104 in which a fin is formed in the substrate, wherein a base of an upper portion of the fin is broader than an apex of the upper portion, wherein the upper portion has first tapered sidewalls and a top surface. The method 100 continues with step 106 in which a gate dielectric covering the first tapered sidewalls and the top surface is formed. The method 100 continues with step 108 in which a conductive gate strip traversing over the gate dielectric is formed, wherein the conductive gate strip has second tapered sidewalls along a longitudinal direction of the fin. The discussion that follows illustrates embodiments of FinFETs that can be fabricated according to the method 100 of FIG. 1.

FIGS. 2A-8C are perspective, top-down, side, and cross-sectional views of a FinFET 200 comprising a tapered gate stack 230 at various stages of fabrication according to various embodiment of the present disclosure. As employed in the present disclosure, the FinFET 200 refers to any fin-based, multi-gate transistor. The FinFET 200 may be included in a microprocessor, memory cell, and/or other integrated circuit (IC). It is noted that, in some embodiments, the performance of the operations mentioned in FIG. 1 does not produce a completed FinFET 200. A completed FinFET 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2A through 8C are simplified for a better understanding of the concepts of the present disclosure. For example, although the figures illustrate the FinFET 200, it is understood an integrated circuit (IC) may comprise a number of other devices comprising resistors, capacitors, inductors, fuses, etc.

Figure 2A:
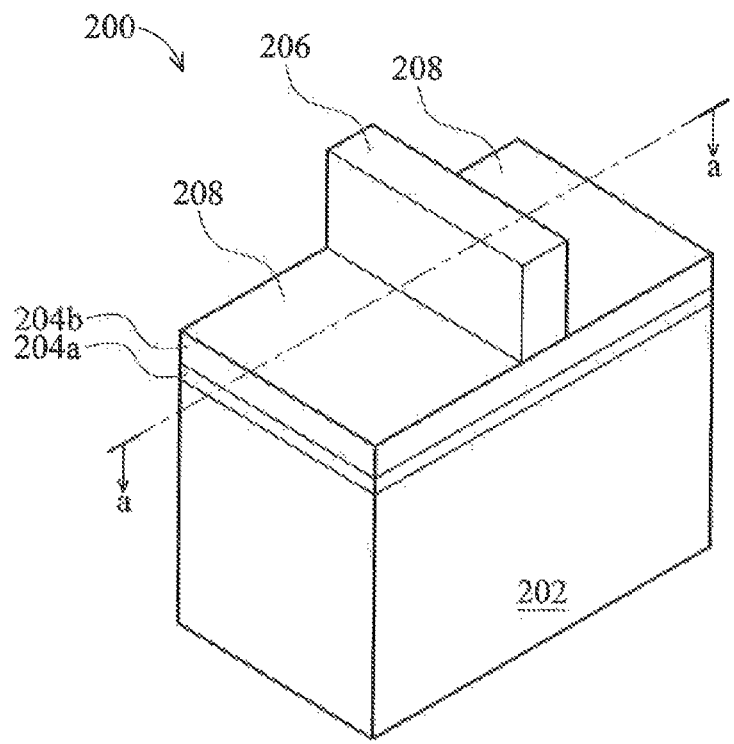
FIGS. 2A-8C are perspective, top-down, side, and cross-sectional views of a FinFET comprising a gate stack at various stages of fabrication according to various embodiment of the present disclosure.
Figure 2B:
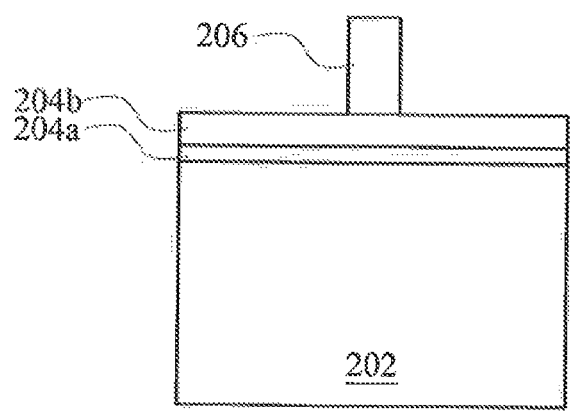

Referring to FIGS. 2A and 2B, and step 102 in FIG. 1, a substrate 202 is provided. FIG. 2A is a perspective view of the FinFET 200 having a substrate 202 at one of the various stages of fabrication according to an embodiment, and FIG. 2B is a cross-sectional view of FinFET 200 taken along the line a-a of FIG. 2A. In at least one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In one embodiment, a pad layer 204a and a mask layer 204b are formed on the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In at least one embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Figure 3A:
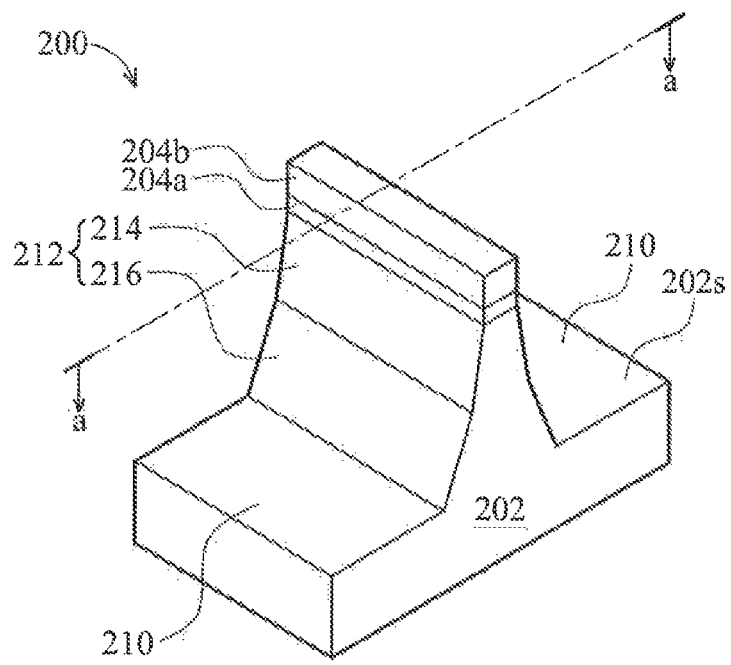
Figure 3B:
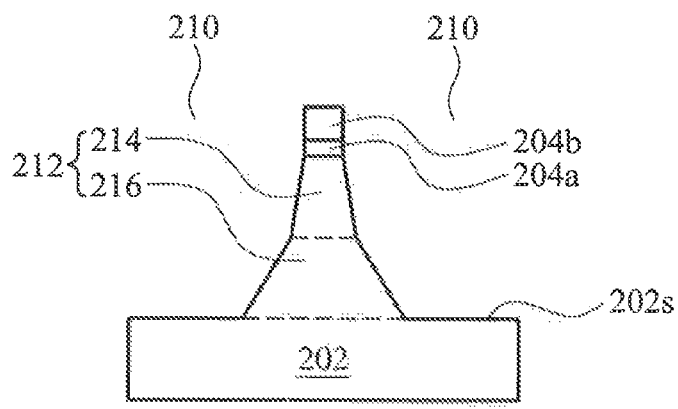
Figure 3C:
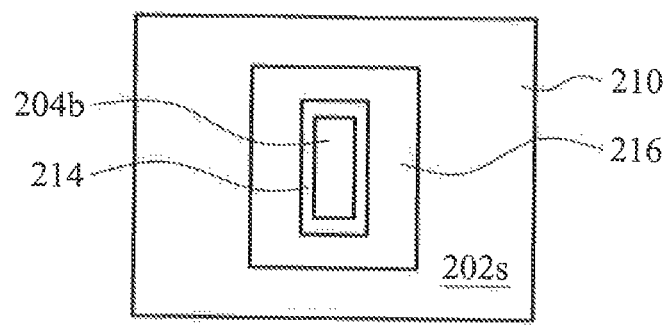
Figure 6A:
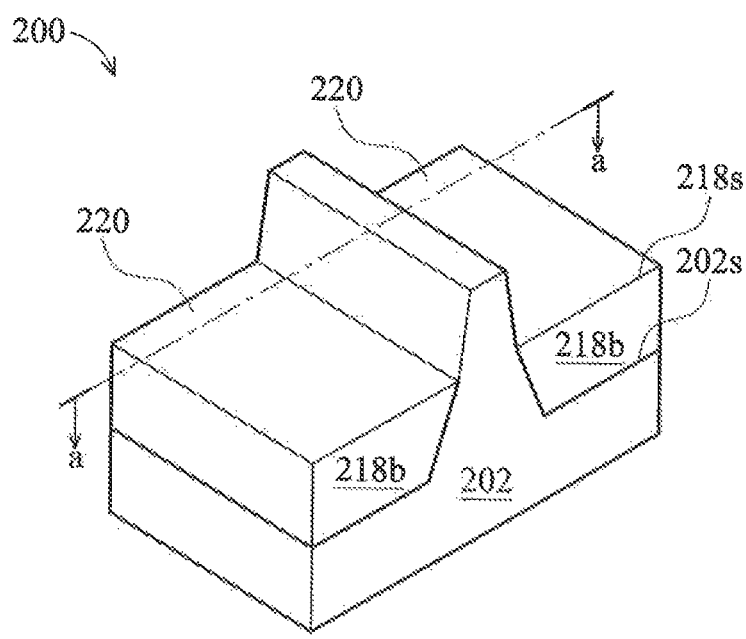
Figure 6B:
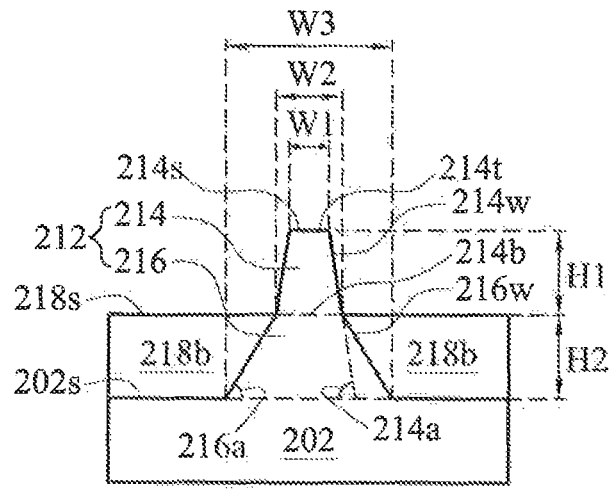
Figure 6C:
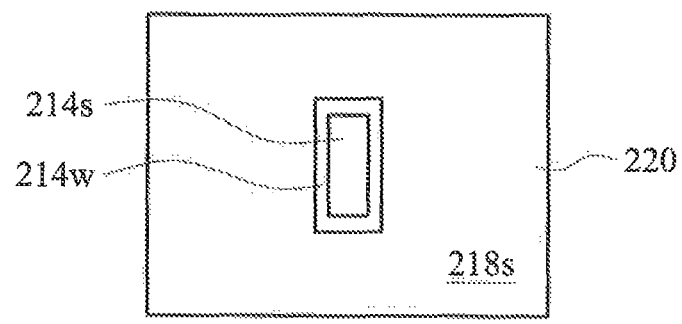

Referring to FIGS. 3A, 3B, and 3C, and step 104 in FIG. 1, after formation of the openings 208 in the photo-sensitive layer 206, the structure in FIGS. 3A, 3B, and 3C is produced by forming a fin 212 in the substrate 202, wherein the base 214b of an upper portion 214 of the fin 212 is broader than the apex 214t, wherein the upper portion 214 has first tapered sidewalls 214w and a top surface 214s (shown in FIGS. 6B and 6C). FIG. 3A is a perspective view of the FinFET 200 at one of the various stages of fabrication according to an embodiment. FIG. 3B is a cross-sectional view of FinFET 200 taken along the line a-a of FIG. 3A and FIG. 3C is a top-down view of FinFET 200 of FIG. 3A.

The mask layer 204b and pad layer 204a are etched through openings 208 to expose underlying semiconductor substrate 202. The exposed semiconductor substrate 202 is then etched to form trenches 210 with a first surface 202s of the semiconductor substrate 202. A portion of the semiconductor substrate 202 between trenches 210 forms one semiconductor fin 212. In the depicted embodiment, the semiconductor fin 212 comprises an upper portion 214 and a lower portion 216 (separated by the dashed line). In the present embodiment, the upper portion 214 and the lower portion 216 comprise the same material, such as silicon.

Trenches 210 may be strips (viewed from in the top of the FinFET 200) parallel to each other, and closely spaced with respect to each other. Trenches 210 each have a width, a depth, and are spaced apart from adjacent trenches by a spacing S. For example, the spacing S between trenches 210 may be smaller than about 30 nm. In an alternative embodiment, trenches 210 may be continuous and surrounding the semiconductor fin 212 (shown in FIG. 3C). The photo-sensitive layer 206 is then removed. Next, a cleaning may be performed to remove a native oxide of the semiconductor substrate 202. The cleaning may be performed using diluted hydrofluoric (DHF) acid.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

Figure 4A:
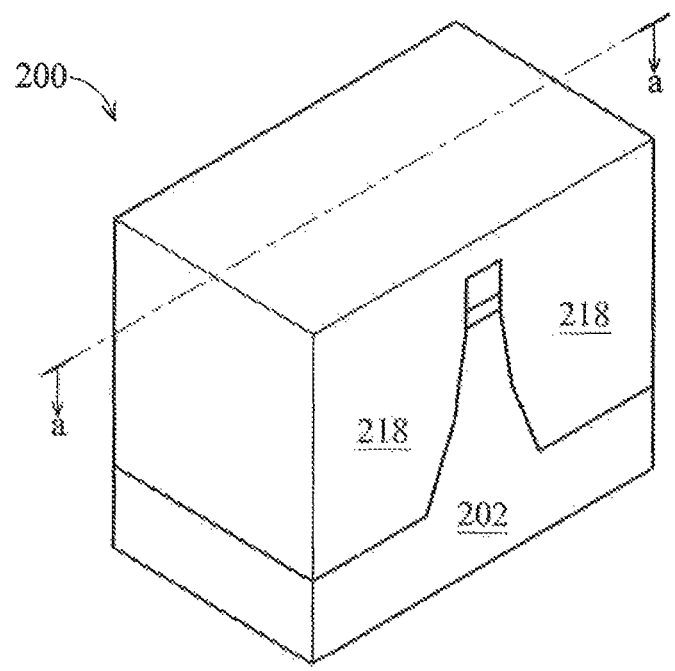
Figure 4B:
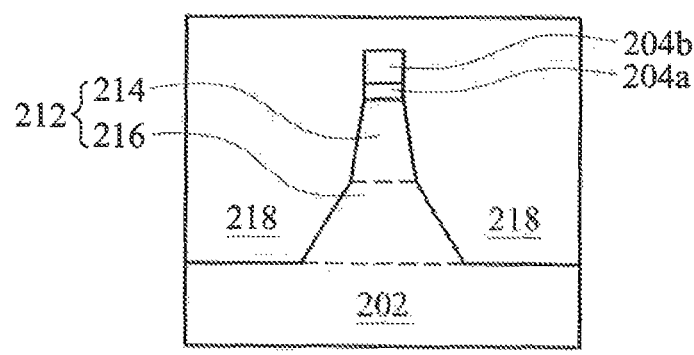

FIG. 4A is a perspective view of the FinFET 200 at one of the various stages of fabrication according to an embodiment, and FIG. 4B is a cross-sectional view of FinFET 200 taken along the line a-a of FIG. 4A. Trenches 210 are filled with a dielectric material 218. The dielectric material 218 may include silicon oxide, and hence is also referred to as oxide 218 in the present disclosure. In some embodiments, other dielectric materials, such as silicon nitride, silicon oxynitride, fluoride-doped silicate glass (FSG), or a low-K dielectric material, may also be used. In an embodiment, the oxide 218 may be formed using a high-density-plasma (HDP) CVD process, using silane ($SiH_4$) and oxygen ($O_2$) as reacting precursors. In other embodiments, the oxide 218 may be formed using a sub-atmospheric CVD (SACVD) process or high aspect-ratio process (HARP), wherein process gases may comprise tetraethylorthosilicate (TEOS) and/or ozone ($O_3$). In yet other embodiment, the oxide 218 may be formed using a spin-on-dielectric (SOD) process, such as hydrogen silsesquioxane (HSQ) or methyl silsesquioxane (MSQ).

Figure 5A:
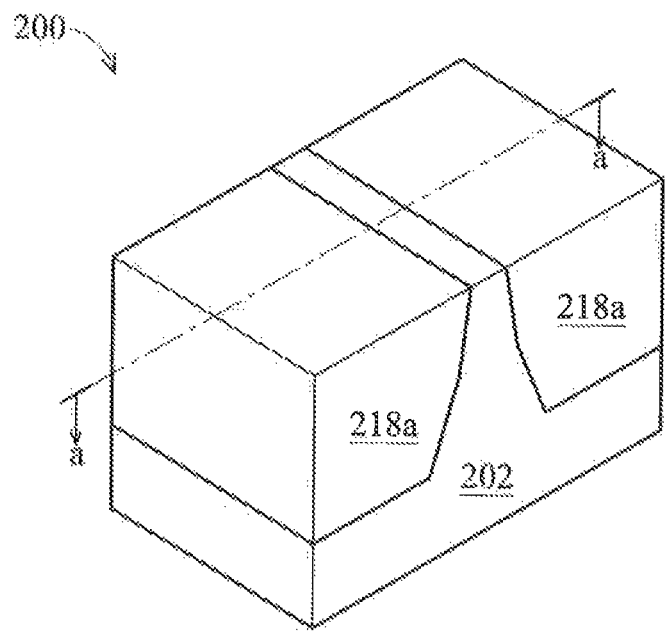
Figure 5B:
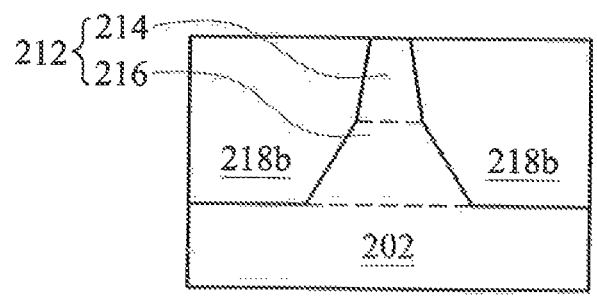

FIGS. 4A and 4B depict the resulting structure after the deposition of the dielectric material 218. A chemical mechanical polish is then performed, followed by the removal of the mask layer 204b and pad layer 204a. The resulting structure is shown in FIGS. 5A and 5B. FIG. 5A is a perspective view of the FinFET 200 at one of the various stages of fabrication according to an embodiment, and FIG. 5B is a cross-sectional view of FinFET 200 taken along the line a-a of FIG. 5A.

The remaining portions of the oxide 218 in the trenches 210 are hereinafter referred to as insulation regions 218a. In double-gate embodiments, the mask layer 204b and pad layer 204a remain on the top of the fin 212 (not shown). In triple-gate embodiments, the mask layer 204b is formed of silicon nitride, the mask layer 204b may be removed using a wet process using hot $H_3PO_4$, while the pad layer 204a may be removed using diluted HF acid, if formed of silicon oxide. The mask layer and pad layer remaining on top of the fin may prevent the top of the fin from turn-on to form a double-gate FinFET. In some alternative embodiments, the removal of the mask layer 204b and pad layer 204a may be performed after the recessing of the insulation regions 218a, which recessing step is shown in FIGS. 6A, 6B, and 6C.

In an alternative embodiment, the upper portion 214 of the fin 212 is replaced by another semiconductor material to enhance device performance. Using insulation regions 218a as a hard mask, the upper portion 214 of the fin 212 is recessed by an etching step. Then a different material such as Ge is epi-grown to fill the recessed portion. In the depicted embodiment, the upper portion 214 of the fin 212 such as Ge and lower portion 216 of the fin 212 such as Si comprise different materials.

As shown in FIGS. 6A, 6B, and 6C, after the removal of the mask layer 204b and pad layer 204a, the insulation regions 218a are recessed by an etching step, resulting in recesses 220. FIG. 6A is a perspective view of the FinFET 200 at one of the various stages of fabrication according to an embodiment. FIG. 6B is a cross-sectional view of FinFET 200 taken along the line a-a of FIG. 6A and FIG. 6C is a top-down view of FinFET 200 of FIG. 6A. In one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

The remaining insulation regions 218b may be strips (viewed from in the top of the FinFET 200) parallel to each other, and closely spaced with respect to each other. In an alternative embodiment, the remaining insulation regions 218b may be continuous and surrounding the semiconductor fin 212 (shown in FIG. 6C). FIG. 6C is top-down view of FinFET 200 of FIG. 6A and further comprises remaining insulation regions 218b not shown in FIG. 6A. Further, the insulation regions 218b cover a portion of the first surface 202s, wherein a top of the insulation region defines a second surface 218s.

In the depicted embodiment, the fin 212 through an opening in the insulation region 218b to a first height $H_1$ above the second surface 218s, wherein the base 214b of an upper portion 214 (shown by the dashed line) of the fin 212 is broader than the apex 214t, wherein the upper portion 214 has first tapered sidewalls 214w and top surface 214s (or defined as a third surface 214s). In one embodiment, the base 214b may be coplanar with the second surface 218s, although the base 214b may also be higher or lower than the second surface 218s. The upper portion 214 of the fin 212 thus is used to form a channel region of the FinFET 200.

In at least one embodiment, an angle 214a of the first tapered sidewalls 214w to the first surface 202s is from about 84 degrees to 88 degrees. In some embodiments, a difference between a maximum width $W_2$ of the first tapered sidewalls 214w and a width $W_1$ of the third surface 214s is in the range of about 1.5 nm to 5 nm. In some embodiments, a first height $H_1$ of upper portion 214 above the second surface 218s is in the range of about 20 to 50 nm.

In some embodiments, the semiconductor fin 212 further comprises a lower portion 216 extending downward from the base 214b to the first surface 202s has a second height $H_2$. The lower portion 216 has third tapered sidewalls 216w. In at least one embodiment, an angle 216a of the third tapered sidewalls 216w to the first surface 202s is from about 60 degrees to 85 degrees. In some embodiments, a difference between a maximum width $W_3$ of the third tapered sidewalls 216w and the maximum width $W_2$ of the first tapered sidewalls 214w is in the range of about 3 nm to 10 nm. In yet another embodiment, a ratio of the first height $H_1$ to the second height $H_2$ is from about 0.2 to 0.5. Having more rigid volume than the upper portion 214, the lower portion 216 can avoid fin 212 deformation of the FinFET 200 due to high stress in the insulation regions 218b.

A tapered gate stack 230 is then formed over the substrate 202 over the first tapered sidewalls 214w and the third surface 214s of the upper portion 214 and extending across the second surface 218s of the insulation region 218b. In some embodiments, the tapered gate stack 230 comprises a gate dielectric 222b and a gate electrode layer 224b over the gate dielectric layer 222b (shown in FIGS. 8A, 8B, and 8C).

Figure 7A:
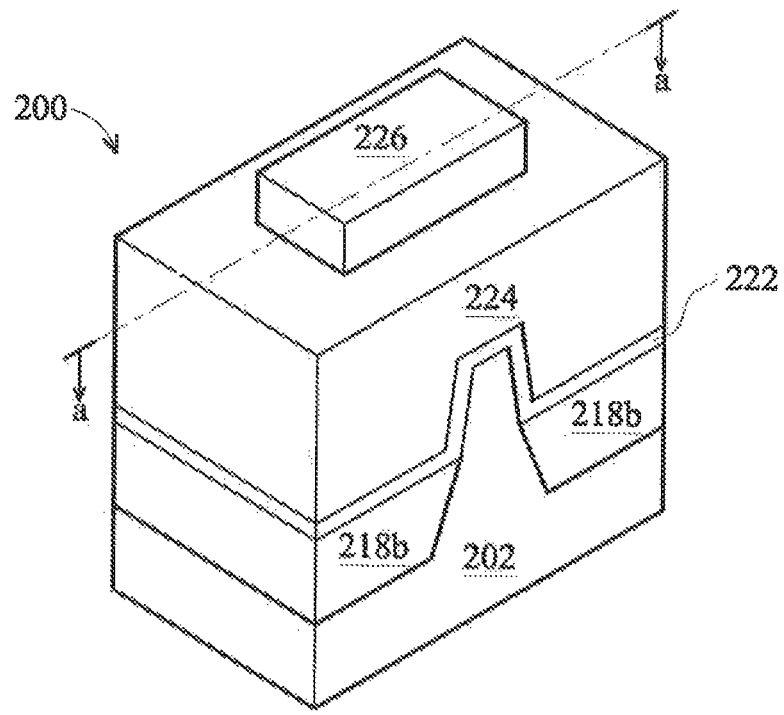
Figure 7B:
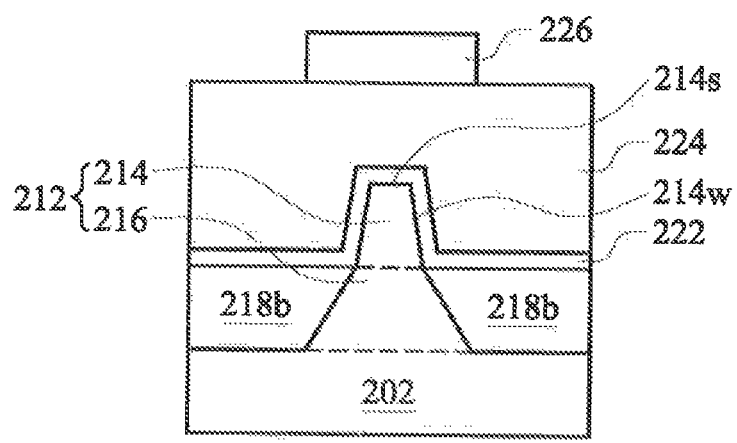

As depicted in FIGS. 7A and 7B, and step 106 in FIG. 1, for fabricating a gate stack (such as a tapered gate stack 230 shown in FIGS. 8A, 8B, and 8C), the structure in FIGS. 7A and 7B are produced by forming a gate dielectric 222 to cover the first tapered sidewalls 214w and the third surface 214s of the upper portion 214 and extending across the second surface 218s of the insulation region 218b. FIG. 7A is a perspective view of the FinFET 200 at one of the various stages of fabrication according to an embodiment, and FIG. 7B is a cross-sectional view of FinFET 200 taken along the line a-a of FIG. 7A.

In some embodiments, the gate dielectric 222 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and/or mixtures thereof. In the depicted embodiment, the gate dielectric 222 is a high-k dielectric layer with a thickness in the range of about 10 angstroms to 30 angstroms. The gate dielectric 222 may be formed using a suitable process such as atomic layer deposition (ALD), chemical vapor deposition (CVD), physical vapor deposition (PVD), thermal oxidation, UV-ozone oxidation, or combinations thereof. The gate dielectric 222 may further comprise an interfacial layer (not shown) to reduce damage between the gate dielectric 222 and upper portion 214 of the fin 212 (i.e., channel region of the FinFET 200). The interfacial layer may comprise silicon oxide.

Then, as depicted in FIGS. 7A and 7B, and step 108 in FIG. 1, the gate electrode layer 224 is formed over the gate dielectric 222. In the present embodiment, the gate electrode layer 224 covering the upper portion 214 of the semiconductor fin 212 is used to form a separate FinFET 200. In an alternative embodiment, the gate electrode layer 224 covers the upper portion 214 of more than one semiconductor fin 212 (not shown), so that the resulting FinFET comprises more than one fin.

In some embodiments, the gate electrode layer 224 may comprise a single-layer or multilayer structure. In at least one embodiment, the gate electrode layer 224 comprises poly-silicon. Further, the gate electrode layer 224 may be doped poly-silicon with uniform or non-uniform doping. In some embodiments, the gate electrode layer 224 comprises a metal selected from a group of W, Cu, Ti, Ag, Al, TiAl, TiAlN, TaC, TaCN, TaSiN, Mn, and Zr. In some embodiments, the gate electrode layer 224 comprises a metal selected from a group of TiN, WN, TaN, and Ru. In the depicted embodiment, the gate electrode layer 224 comprises a thickness in the range of about 30 nm to about 60 nm. The gate electrode layer 224 may be formed using a suitable process such as ALD, CVD, PVD, plating, or combinations thereof.

The process steps up to this point have provided the substrate 202 having the gate dielectric 222 covering the first tapered sidewalls 214w and third surface 214s of the upper portion 214, and the gate electrode layer 224 formed over the gate dielectric 222. In some embodiments, a layer of photoresist is formed over the gate electrode layer 224 by a suitable process, such as spin-on coating, and patterned to form a patterned photoresist feature 226 over the gate electrode layer 224 by a proper lithography patterning method. The patterned photoresist feature 226 can then be transferred using a dry etching process to the underlying layers (i.e., the gate dielectric 222 and gate electrode layer 224) to form a gate stack along the longitudinal direction of the fin 212. The patterned gate electrode layer is referred to a conductive gate strip. The conductive gate strip thus wraps a channel portion of the exposed upper portion 214 of the fin 212.

However, the conductive gate strip along the longitudinal direction of the fin 212 (with the first tapered sidewalls 214w) is perpendicular to the first surface 202s. As such, the first tapered sidewalls 214w with a wider bottom are not fully wrapped by the conductive gate strip, resulting in a non-fully depleted fin when the FinFET is in on-state. This decreases drain-induced-barrier-lowering (DIBL) and increases sub-threshold leakage on a lower portion of the first tapered sidewalls 214w, thereby degrading the device performance.

Accordingly, the processing discussed below with reference to FIGS. 8A, 8B, and 8C may etch the gate dielectric 222 and gate electrode layer 224 to form a tapered gate stack along the longitudinal direction of the fin 212 to fully wrap the wider bottom of the first tapered sidewalls 214w. This can help to form a fully depleted fin when the FinFET is in on-state, thereby improving DIBL and sub-threshold leakage of the FinFET 200 and thus upgrading device performance.

Figure 8A:
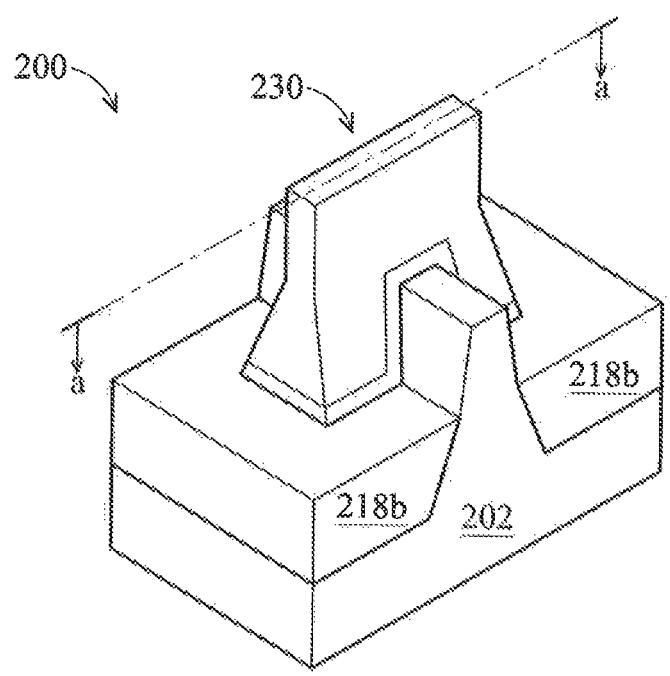
Figure 8B:
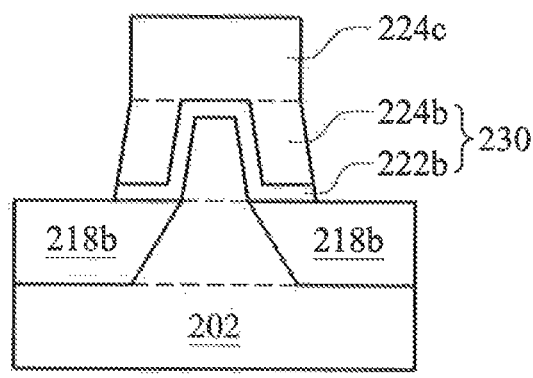
Figure 8C:
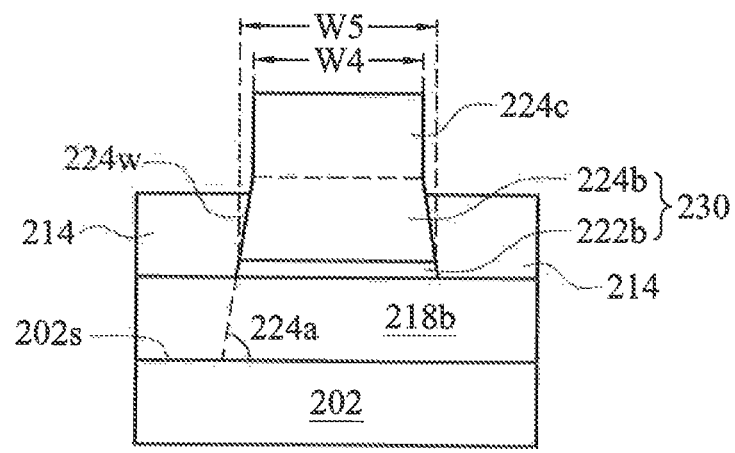

As depicted in FIGS. 8A, 8B, and 8C, and step 108 in FIG. 1, for fabricating a tapered gate stack 230, the structure in FIGS. 8A, 8B, and 8C Figs. are produced by forming a conductive gate strip 224b traversing over the gate dielectric 222b, wherein the conductive gate strip 224a has second tapered sidewalls 224w along the longitudinal direction of the fin 212. FIG. 8A is a perspective view of the FinFET 200 at one of the various stages of fabrication according to an embodiment. FIG. 8B is a cross-sectional view of FinFET 200 taken along the line a-a of FIG. 8A and FIG. 8C is a side view of FinFET 200 along a plane perpendicular to the line a-a of FIG. 8A.

As depicted in FIGS. 8A, 8B and 8C, the patterned photoresist feature 226 can then be transferred using a dry etching process to the underlying layers (i.e., the gate dielectric 222 and gate electrode layer 224) to form the tapered gate stack 230 along longitudinal direction of the fin 212. In at least one embodiment, in which the gate electrode layer 224 is polysilicon, the step of the dry etch process is performed under a source power of about 650 to 800 W, a bias power of about 100 to 120 W, and a pressure of about 60 to 200 mTorr, using $Cl_2$, HBr and He as etching gases. The patterned photoresist feature 226 may be stripped thereafter.

In the depicted embodiment, a remaining gate dielectric 222b covers the first tapered sidewalls 214w and the third surface 214s, while a remaining gate electrode layer 224b (or referred as a conductive gate strip 224b) traverses over the remaining gate dielectric 222b, wherein the conductive gate strip 224b has second tapered sidewalls 224w along the longitudinal direction of the fin 212. In at least one embodiment, an angle 224a of the second tapered sidewalls 224w to the first surface 202s is from about 85 degree to 88 degree. In some embodiments, a ratio of a maximum width $W_5$ of the second tapered sidewalls 224w to a minimum width $W_4$ of the second tapered sidewalls 224w is from 1.05 to 1.25. In some embodiments, the conductive gate strip 224b further comprises a substantially vertical portion 224c over the second tapered sidewalls 224w.

In the depicted embodiment, the remaining gate dielectric 222b and conductive gate strip 224b are combined and referred as the tapered gate stack 230. The tapered gate stack 230 may wrap the wider bottom of the first tapered sidewalls 214w. Thus, method 100 can help to form a fully depleted fin when the FinFET is in on-state, thereby improving DIBL and sub-threshold leakage of the FinFET 200 and thus upgrading device performance.

In the depicted embodiment, the tapered gate stack 230 is fabricated using a gate-first process. In an alternative embodiment, the tapered gate stack 230 may be fabricated using a gate-last process. In one embodiment, the gate-last process comprises forming an inter-layer dielectric (ILD) surrounding the dummy tapered gate stack 230, removing a dummy conductive gate strip to form a trench in the ILD, then fill the trench with a conductive gate strip. In some embodiments, the gate-last process comprises forming an ILD surrounding a dummy tapered gate stack, removing the dummy conductive gate strip 224b and a dummy gate dielectric to form a trench in the ILD, then fill the trench with a gate dielectric and a conductive gate strip.

It is understood that the FinFET 200 may undergo further CMOS processes to form various features such as source/drain regions, contacts/vias, interconnect metal layers, dielectric layers, passivation layers, etc. It has been observed that a modified gate stack may wrap the wider bottom of the first tapered sidewalls 214w to form a fully depleted fin when the FinFET is in on-state, thereby improving DIBL and sub-threshold leakage of the FinFET 200 and thus upgrading device performance.

In accordance with embodiments, a Fin field effect transistor (FinFET) comprises a fin having a first height above a first surface of a substrate, wherein a portion of the fin has first tapered sidewalls, and the fin has a top surface; an insulation region over a portion of the first surface of the substrate, wherein a top of the insulation region defines a second surface; a gate dielectric over the first tapered sidewalls and the top surface; and a conductive gate strip over the gate dielectric, wherein the conductive gate strip has second tapered sidewalls along a longitudinal direction perpendicular to the first height, and a first width between the second tapered sidewalls in the longitudinal direction is greater at a location nearest to the substrate than a second width at a location farthest from the substrate.

In accordance with other embodiments, a method of making a Fin field effect transistor (FinFET) comprises forming a fin having a first height above a first surface of a substrate, wherein a portion of the fin has first tapered sidewalls, and the fin has a top surface; forming an insulation region over a portion of the first surface of the substrate, wherein a top of portion of the insulation region defines a second surface; covering the first tapered sidewalls and the top surface with a gate dielectric; and forming a conductive gate strip traversing over the gate dielectric, wherein the conductive gate strip has second tapered sidewalls along a longitudinal direction perpendicular to the first height, and a space between the second tapered sidewalls in the longitudinal direction is greater at a location nearest to the substrate than at a location farthest from the substrate.

In accordance with yet other embodiments, a Fin field effect transistor (FinFET) comprises a fin having a first height above a first surface of a substrate, wherein the fin comprises a top surface, first tapered sidewalls and lower tapered sidewalls; an insulation region in contact with the lower tapered sidewalls, wherein a top of the insulation region defines a second surface; a gate dielectric over the first tapered sidewalls and the top surface, wherein the gate dielectric has exterior tapered sidewalls along a longitudinal direction perpendicular to the first height, and a distance between the exterior tapered sidewalls in the longitudinal direction is greater at a location nearest to the substrate than at a location farthest from the substrate; and a conductive gate strip over the gate dielectric.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A Fin field effect transistor (FinFET) comprising:
    a fin having a first height above a first surface of a substrate, wherein a portion of the fin has first tapered sidewalls, the first tapered sidewalls are tapered in a first direction, and the fin has a top surface;
    an insulation region over a portion of the first surface of the substrate, wherein a top of the insulation region defines a second surface;
    a gate dielectric over the first tapered sidewalls and the top surface; and
    a conductive gate strip over the gate dielectric, wherein the conductive gate strip has second tapered sidewalls tapered in a second direction perpendicular to the first height and the first direction, and a first width between the second tapered sidewalls in the second direction is greater at a location nearest to the substrate than a second width at a location farthest from the substrate.

2. The FinFET of claim 1, wherein the gate dielectric comprises at least one of Li, Be, Mg, Ca, Sr, Sc, Y, Zr, Hf, Al, La, Ce, Pr, Nd, Sm, Eu, Gd, Tb, Dy, Ho, Er, Tm, Yb, or Lu.

3. The FinFET of claim 1, wherein the conductive gate strip is doped poly-silicon.

4. The FinFET of claim 1, wherein the conductive gate strip comprises W, Cu, Ti, Ag, Al, TiAl, TiAlN, YaC, TaCN, TaSiN, Mn, TiN, WN, TaN, Ru, or Zr.

5. The FinFET of claim 1, wherein the conductive gate strip has a thickness ranging from about 30 nanometers (nm) to about 60 nm.

6. The FinFET of claim 1, wherein the insulation region comprises a plurality of strips.

7. The FinFET of claim 1, wherein the first height ranges from about 20 nm to 50 nm.

8. The FinFET of claim 1, wherein a ratio of the second width to the first width ranges from 1.05 to 1.25.

9. The FinFET of claim 1, wherein an angle of the first tapered sidewalls to the first surface ranges from about 84 degrees to 88 degrees.

10. The FinFET of claim 1, wherein the substrate comprises at least one doped region.

11. A Fin field effect transistor (FinFET) comprising:
a fin having a first height above a first surface of a substrate, wherein the fin comprises a top surface, first tapered sidewalls and lower tapered sidewalls, and the first tapered sidewalls are tapered in a first direction;
an insulation region in contact with the lower tapered sidewalls, wherein a top of the insulation region defines a second surface;
a gate dielectric over the first tapered sidewalls and the top surface, wherein the gate dielectric has exterior tapered sidewalls tapered in a second direction perpendicular to the first height and the first direction, and a distance between the exterior tapered sidewalls in the longitudinal direction is greater at a location nearest to the substrate than at a location farthest from the substrate; and
a conductive gate strip over the gate dielectric.

12. The FinFET of claim 11, wherein the first tapered sidewalls and the exterior tapered sidewalls are substantially parallel.

13. A Fin field effect transistor (FinFET) comprising:
a fin having a first height above a first surface of a substrate, wherein the fin comprises a first section and a second section over the first section, a width in a first direction of the first section closest to the substrate is greater than a width in the first direction of the first section closest to the second section, and a width in the first direction of the second section closest to the first section is greater than a width in the first direction of the second section farthest from the first section;
an insulation region over the first section;
a gate dielectric over the second section and over a top surface of the fin; and
a conductive gate strip over the gate dielectric, wherein the conductive gate strip has a first portion and a second portion over the first portion, and a width in a second direction of the first portion closest to the substrate is greater than a width in the second direction of the first portion closest to the second portion, and the first direction is perpendicular to the second direction.

14. The FinFET of claim 13, wherein the second portion has sidewalls substantially perpendicular to a top surface of the substrate.

15. The FinFET of claim 13, wherein the first portion extends above the top surface of the fin.

16. The FinFET of claim 13, wherein the width of the first section is measured in a direction perpendicular to the width of the first portion.

17. The FinFET of claim 13, wherein a top surface of the insulation region is substantially level with a top of the first section.

18. The FinFET of claim 13, wherein the second section is in direct contact with the first section.

19. The FinFET of claim 13, wherein the second portion is in direct contact with the first portion.

20. The FinFET of claim 13, wherein an angle between a top surface of the substrate and a sidewall of the first section is less than an angle between the top surface of the substrate and a sidewall of the second section.

* * * * *